United States Patent
Völkl et al.

Patent Number: 5,707,446
Date of Patent: Jan. 13, 1998

[54] DEVICE FOR PRODUCING SIC SINGLE CRYSTALS

[75] Inventors: Johannes Völkl; Peter Lanig, both of Erlangen, Germany

[73] Assignee: Siemens Aktiengesellschaft, München, Germany

[21] Appl. No.: 530,291

[22] PCT Filed: Mar. 21, 1994

[86] PCT No.: PCT/DE94/00311

§ 371 Date: Sep. 29, 1995

§ 102(e) Date: Sep. 29, 1995

[87] PCT Pub. No.: WO94/23096

PCT Pub. Date: Oct. 13, 1994

[30] Foreign Application Priority Data

Apr. 1, 1993 [DE] Germany ............... 43 10 744.3

[51] Int. Cl.$^6$ .................................................. C30B 35/00
[52] U.S. Cl. ............................................................. 117/200
[58] Field of Search .................... 117/88, 200, 84, 117/89, 102, 105; 118/715, 725

[56] References Cited

U.S. PATENT DOCUMENTS

| | | | |
|---|---|---|---|
| 4,778,559 | 10/1988 | McNeilly | 118/728 |
| 4,866,005 | 9/1989 | Davis et al. | 437/100 |
| 4,956,046 | 9/1990 | McNeilly | 117/88 |

FOREIGN PATENT DOCUMENTS

| | | |
|---|---|---|
| 0 554 047 | 4/1993 | European Pat. Off. |
| 32 30 727 | 2/1984 | Germany |
| 0 346 864 | 7/1960 | Switzerland |

OTHER PUBLICATIONS

Patent Abstracts of Japan, vol. 14, No. 211, 2 May 1990 & JP-A-02 048 495 (Sanyo Electric) 19 Feb. 1990.

Patent Abstracts of Japan, vol. 13, No. 328, 24 Jul. 1989 & JP-A-01 108 200 (Sanyo Electric) 25 Apr. 1989.

Journal of Crystal Growth 109 (1991) pp. 17–23, 1991, Elsevier Science Publishers B.V. (North-Holland), D.L. Barrett et al.: SiC boule growth by sublimation vapor transport.

Berichte der Deutschen Keramischen Gesellschaft e.V., A. Dietzel, Würzburg, DE, vol. 32, No. 8, pp. 229–250, Aug. 1955.

*Primary Examiner*—Felisa Garrett
*Attorney, Agent, or Firm*—Kenyon & Kenyon

[57] ABSTRACT

SiC single crystals are produced in a reaction chamber, in which there is a seed crystal for the separation of a SiC single crystal from the gas phase. The reaction chamber is connected to a storage chamber, which is at least partly filled with a supply of SiC, by a gas channel with a predetermined cross-section for conveying the SiC in the gas phase. The supply of SiC is sublimated in a heating device and a temperature gradient is adjusted in the reaction chamber. It is, thus, possible to produce SiC single crystals with any desired cross-sectional area and of high crystalline quality and single-crystal yield, because the conveyance rate of the gas molecules can be precisely adjusted.

14 Claims, 3 Drawing Sheets

DEVICE FOR PRODUCING SIC SINGLE CRYSTALS

BACKGROUND OF THE INVENTION

The invention relates to a device and a process for producing single crystals from silicon carbide (SiC).

A known process for producing SiC single crystals is the sublimation of technical grade SiC in powder form and growing of this SiC out of the gas phase on a monocrystalline SiC seed crystal. In the case of a first known device for implementing such a process, a cylindrical reaction vessel is provided in a vacuum installation, and the outer wall of this vessel surrounds a hollow cylindrical heating wall and an upper and lower heating plate. The heating wall and the heating plates consist of electrographite and are inductively coupled to a high-frequency (HF) heating coil arranged outside of the vacuum installation. A hollow cylindrical cylinder wall made of porous graphite is arranged inside the heating wall, concentrically to the heating wall. This intermediate wall separates a likewise hollow cylindrical supply chamber between the intermediate wall and the heating wall from a cylindrical reaction chamber inside the intermediate wall. A flat SiC seed crystal is arranged in the lower part of the reaction chamber symmetrically to the cylinder axis. A SiC supply that fills the supply chamber is heated by means of the heating wall and the heating plates to a temperature of about 2000° C. to about 2500° C., and the solid SiC is sublimated. The gas mixture that is formed thereby from the main components Si, $Si_2C$ and $SiC_2$, also referred to in the following as "SiC in the gas phase" diffuses through the pores of the graphite into the upper part of the reaction chamber and, from there, to the seed crystal that is retained at a crystallization temperature of about 1900° C. to 2200° C. The SiC crystallizes out on the seed crystal. The temperature gradient between the upper part and the lower part of the reaction chamber is adjusted, at the most, to 20° C./cm, in that an additional thermal insulation and/or an additional heating is provided for the upper heating plate and an additional cooling is provided for the seed crystal. Moreover, a protective gas, preferably argon (Ar) is fed into the reaction chamber to adjust a pressure of about 1 to 5 mbar, which counteracts the vapor pressure of the SiC in the gas phase. With such a device, it is possible to produce SiC single crystals having a length of at least 30 mm and a diameter of up to 40 mm (German C-32 30 727).

In the case of another known device, in place of a common HF-coil outside of the vacuum vessel, two resistance heaters are disposed inside of the vacuum vessel. One of these two resistance heaters is provided for heating a powdery SiC supply in a supply chamber to a sublimation temperature of typically about 2300° C., and the other resistance heater is provided for heating the crystallization surface on a seed crystal disposed in a reaction chamber to a crystallization temperature of typically 2200° C. The reaction chamber is disposed in this case above the supply chamber and separated from it by a separating wall of porous graphite. The temperature of the SiC powder and the temperature at the crystallization surface can be controlled independently of one another during the manufacturing process by means of the two resistance heaters, which are independent of one another. Therefore, the temperature gradient between the SiC powder in the supply chamber and the crystallization surface in the reaction chamber evolves by itself when these two temperatures are specified in dependence upon the thermal properties of the system, in particular upon the thermal transition coefficients of the materials and its geometry. The growth process of the single crystal growing on the seed crystal can be positively influenced by this independent adjustment of the sublimation temperature and of the crystallization temperature. To adjust a nearly constant temperature gradient during the crystal growth between the crystallization surface on the growing single crystal and the SiC powder, whose volume is decreasing during the process, the seed crystal and the growing single crystal are disposed on a shaft so as to be axially movable toward or away from the SiC powder surface. Moreover, this shaft is rotatable, so that a dynamically balanced growth is achieved and spatial fluctuations in the gas flow are averaged out. SiC crystals of the 6H modification having a 12 mm diameter and 6 mm height were produced using such a device (U.S. Pat. No. 4,866,005).

Due to surface reactions at the surface of the pores in the graphite of the intermediate wall, one cannot avoid impurities in the grown SiC single crystal when known methods are used. Moreover, the pore size of the graphite of the intermediate wall is subject to relatively large fluctuations, depending on the manufacturing process. Consequently, the conveyance of gas through the pores and, thus, also the growth rate of the monocrystalline SiC are not able to be exactly adjusted. Finally, only one single monocrystal can be produced per deposition process, since it is necessary for the seed crystal and, thus, the grown single crystal to be arranged in the area of the axis of symmetry due to the radial input of heat from the outside and the axial dissipation of heat to the outside.

This invention is directed to a device to enable the three essential partial processes, sublimation, gas conveyance and crystallization, to be better controlled and to a process for producing SiC single crystals, so as to allow the crystal quality, the single crystal yield and the size of the single crystals to be increased. Moreover, an object of the present invention is to enable a plurality of single crystals to be grown at the same time.

SUMMARY OF THE INVENTION

The present invention solves this problem by providing a supply chamber containing the SiC supply and a reaction chamber containing the seed crystal. These chambers are disposed so as to be spatially separated from one another and are connected to one another by a gas channel having a well defined cross-section. By this means, the geometry and, in particular, the volumes of the supply chamber and of the reaction chamber can be selected independently of one another and any desired crystal diameters can be achieved in contrast to the cylindrical-concentric arrangement in the case of the previously described Prior Art. Furthermore, given a preselected pressure and a preselected temperature distribution within the system, the particle stream of the gas molecules of the SiC in the gas phase can be adjusted both with respect to its size as well as its direction by the dimensions and arrangement of the gas channel.

Advantageous developments in accordance with the invention are revealed by each of the dependent subordinate claims.

DETAILED DESCRIPTION

Figure 1:
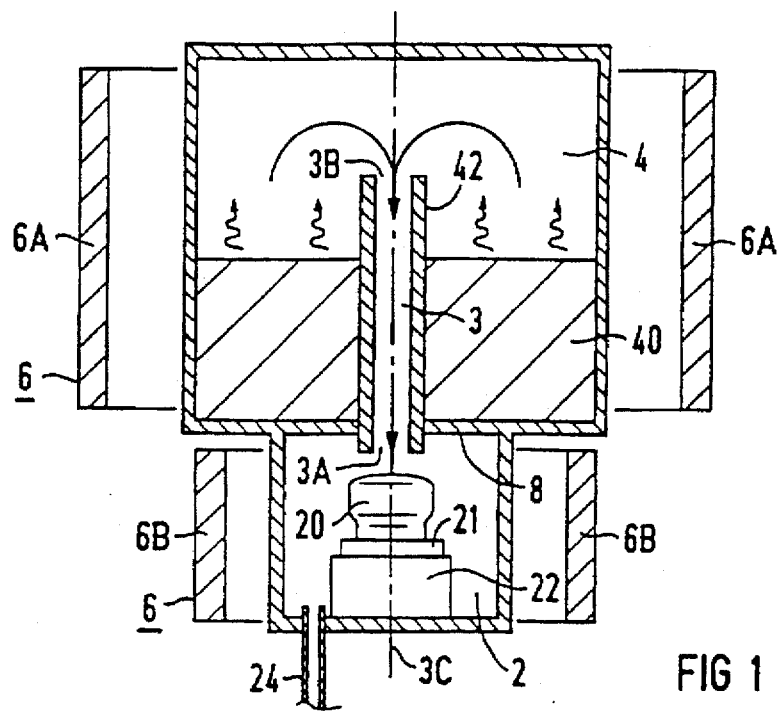
FIG. 1 is a cross sectional view of an example of the device for producing SiC single crystals according to an embodiment of the present invention, including a supply chamber arranged above the reaction chamber.

The same parts are given the same reference numerals in each case. In FIG. 1, a reaction chamber is designated by 2, a seed crystal by 21, its seed chuck by 22, a supply chamber by 4, a supply of solid SiC by 40, a retaining device for the supply 40 by 42, a separating wall by 8, a gas channel by 3, whose intake port is denoted by 3B and exhaust port by 3A, as well as whose center axis by 3C, and a heating device by 6. In its lower part, the supply chamber 4 is filled with the supply 40. The supply 40 is preferably comprised of technical grade SiC in a powder form or of solid, generally polycrystalline SiC, and can also contain dopants for doping the SiC single crystal. The reaction chamber 2 is arranged below the supply chamber 4. The supply chamber 4 and the reaction chamber 2 are separated from one another by the impermeable separating wall 8 and interconnected by the gas channel 3, which has a definitively preselected cross-section and runs through the separating wall 8. Thus, it is possible to adjust the gas conveyance rate and also the direction of the gas particle stream. The cross-section of the gas channel 3 is generally selected to be between 0.05 mm$^2$ and 200 mm$^2$ and, preferably, between 0.1 mm$^2$ and 100 mm$^2$ and can vary along the length of the gas channel 3 in a specified manner.

To ensure that solid SiC cannot reach the reaction chamber 2 from the supply chamber 4, the retaining device 42 for the supply 40 is provided. Preferably, the gas channel 3 is developed at the same time along with this retaining device 42. The intake port 3B of the gas channel 3 then lies higher than the filling level of the supply 40. A conduit can be provided for this purpose, which is higher than the filling level of the supply 40 and is inserted through an opening in the separating wall 8.

The supply 40 is heated by its associated heating device 6A and is partially decomposed. A portion of the SiC sublimates, and the individual components Si, $Si_2C$ and $SiC_2$ of the SiC in the gas phase are conveyed along the direction of the sketched arrows through the gas channel 3 into the reaction chamber 2. The seed crystal 21 is arranged on the seed chuck 22 in the lower part of the reaction chamber 2. A single crystal 20 grows on this seed crystal 21 as the result of the crystallization of the SiC out of the gas phase.

By properly configuring the gas channel 3, it is possible to selectively direct the SiC gas stream in a desired direction at the crystallization surface of the seed crystal 21 or of the single crystal 20. In the depicted specific embodiment, the center axis 3C of the gas channel 3 is directed at least nearly perpendicularly to the growth base of the flat seed crystal 21, on which the single crystal 20 grows. Thus, one achieves a stabilization of the convex phase boundary at the surface of the growing single crystal 20, since the SiC is predominantly deposited from the vapor phase in the middle and becomes depleted toward the outside.

Preferably, the two heating devices 6A and 6B are provided separately for the supply chamber 4 and the reaction chamber 2, and can be parts of a heating device 6 or completely independent of one another. This measure renders possible an easily controllable temperature distribution between the SiC supply 4 and the SiC single crystal 20.

The seed crystal 21 and the crystallization surface on the single crystal 20 are then retained at a crystallization temperature, which is lower than the sublimation temperature at the supply 40, by means of the heating device 6B assigned to the reaction chamber 2, as part of the heating device 6.

The heating device 6 can be designed as a wall system that is inductively coupled to a high-frequency (HF) heating coil (not shown) arranged outside of the system, or also as a resistance heater. Preferably, the heating powers of the two heating devices 6A and 6B are able to be controlled independently of one another to heat the supply 2 or the crystallization surface.

In one especially advantageous specific embodiment, means are provided for supplying a protective gas, of which only one supply line 24 is preferably depicted, which leads into the reaction chamber 2. By this means, the pressure in the reaction chamber 2 and in the supply chamber 4 can be additionally adjusted, which then results as the sum of the vapor partial pressures of the components of the SiC in the gas phase and of the partial pressure of the protective gas. Thus, one can influence the sublimation rate of the SiC. Typical pressures lie between about 1 mbar and about 100 mbar and preferably between 1 mbar and 20 mbar. Generally, one uses an inert gas, preferably argon, as a protective gas. Moreover, the vapor pressure of the SiC depends exponentially on the temperature, so that the sublimation rate and, thus, the crystal growth rate can be adjusted by controlling the sublimation temperature. To control these two essential parameters, pressure and temperature, a controller (not shown) is preferably used, which is electrically connected to the means for introducing the protective gas and to the heating devices. These two parameters are, thus, able to be precisely adjusted, so that the growth rate can also be exactly controlled. The means for supplying a protective gas into the supply chamber or the reaction chamber 2 are also preferably used to evacuate the system prior to the deposition process.

Figure 2:
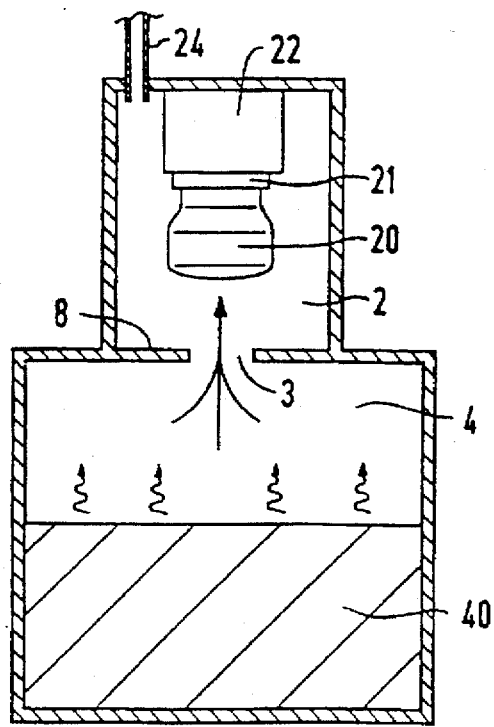
FIG. 2 is a cross sectional view of another embodiment of the present invention, including a supply chamber arranged below the reaction chamber.

In one specific embodiment in accordance with FIG. 2, the supply chamber 4 is arranged below the reaction chamber 2. The gas channel 3 is now preferably designed as a simple opening in the separating wall 8. The seed chuck 22 with the seed crystal 21 attached to it is suspended in the upper part of the reaction chamber 2, so that the seed crystal 21 and the single crystal 20 deposited on it are turned toward the opening of the gas channel 3. In this exemplary embodiment, in addition to the temperature gradient, one makes use of the thermal buoyancy forces occurring during the gas conveyance of the sublimated SiC.

The volumes of the supply chamber 4 and of the reaction chamber 2 can vary in magnitude and be selected to be substantially independent of one another. Generally, however, the volume of the supply chamber 4 is selected to be larger than that of the reaction chamber 2. Also, the spatial arrangement of the supply chamber 4 and of the reaction chamber 2 relative to one another can be selected in any way desired and, in particular, is not limited to the vertical and axial-symmetrical specific embodiments pursuant to FIG. 1 or 2.

Figure 3:
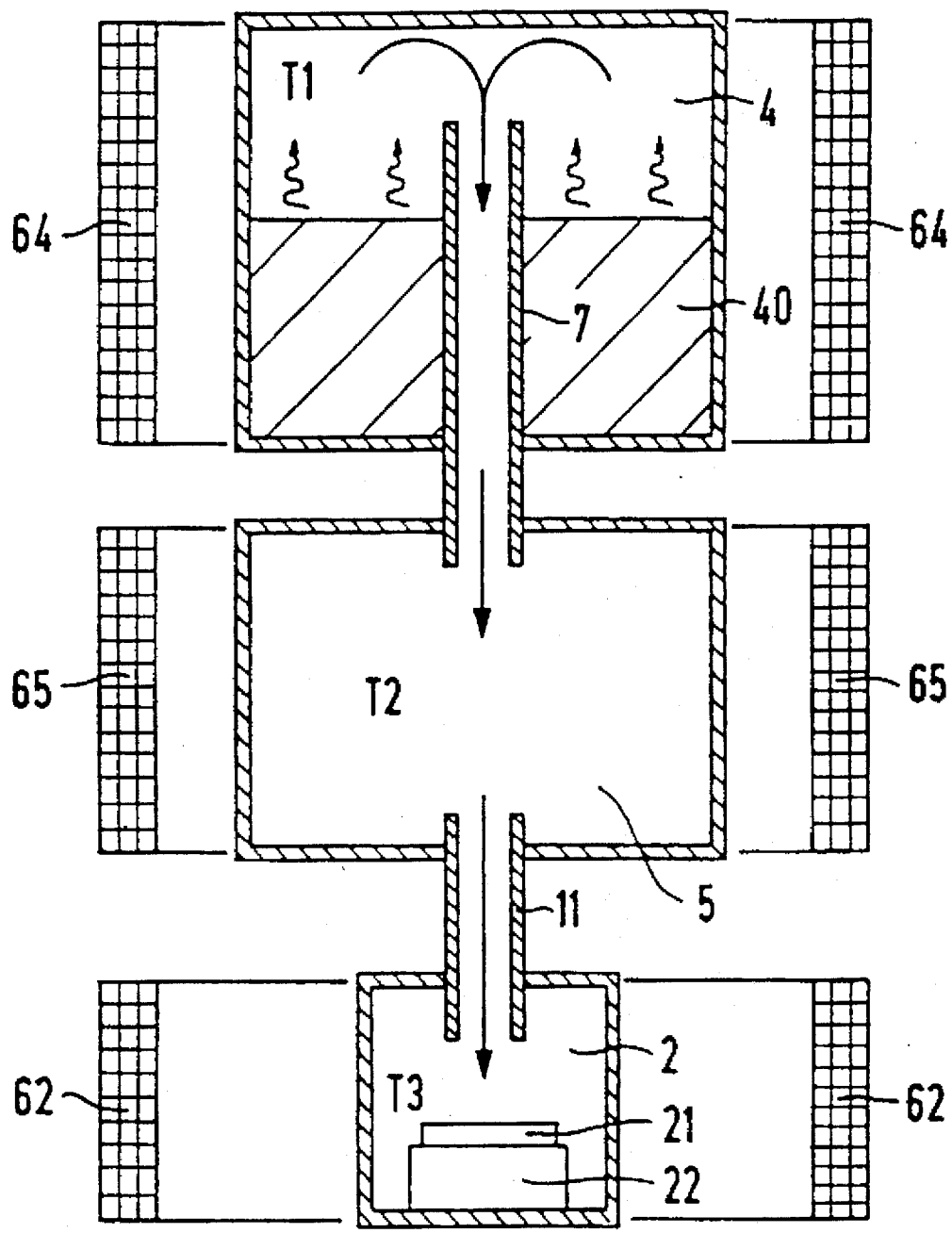
FIG. 3 is a cross sectional view of a third embodiment of the present invention including a homogenization chamber arranged between the supply chamber and the reaction chamber and connected with these chambers by a gas channel.

FIG. 3 depicts a specific embodiment comprising a homogenization chamber 5, which is arranged with respect to the gas stream between the reaction chamber 2 and the supply chamber 4 and which is connected via a partial gas channel 11 to the reaction chamber 2 and via another partial gas channel 7 to the supply chamber 4. Preferably, the three chambers are arranged axially over one another. This makes it possible for cylindrical heating devices to be used. Thus, on its path from the supply chamber 4 to the reaction chamber 2, the gas stream from the three components Si, $Si_2C$ and $SiC_2$ passes the homogenization chamber 5, which is heated to a temperature $T_2$ lying generally between the sublimation temperature $T_1$ and the crystallization temperature $T_3$. The vapor pressures of the individual components of the SiC in the gas phase depend to varying degrees on this temperature $T_2$. Thus, the stoichiometric proportions $Si:Si_2C:SiC_2$ of the three components can be altered in the homogenization chamber 5 by controlling its temperature $T_2$. To independently adjust the temperatures $T_1$, $T_2$ and $T_3$, a heating device 62 is assigned to the reaction chamber 2, a heating device 65 to the homogenization chamber 5, and a heating device 64 to the supply chamber 4, which are each depicted as resistance heaters.

Figure 4:
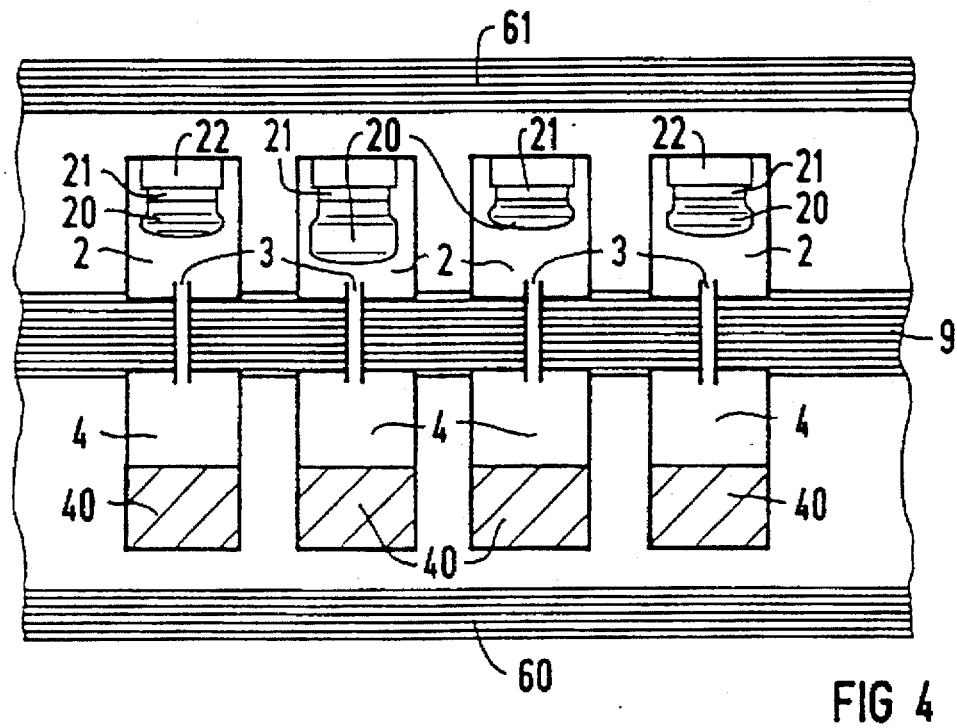
FIG. 4 is a cross sectional view of a fourth embodiment of the present invention including a plurality of systems, which are composed in each case of a supply chamber, a reaction chamber, and a gas channel and which have a common heating system.

One special advantage of the process and of the device in accordance with the invention is the possibility of producing a plurality of SiC single crystals simultaneously. In one specific embodiment pursuant to FIG. 4, several systems composed of a reaction chamber 2, a gas channel 3, and a supply chamber 4 are provided side by side. In one specific embodiment, systems are depicted in accordance with FIG. 2 with reaction chambers 2 disposed above and supply chambers 4 disposed below. It is also possible, however, to provide systems in one specific embodiment in accordance with FIG. 1. A common heating device 61 is assigned to the reaction chambers 2, and a common heating device 60 is assigned to the supply chambers 4. To control the temperatures in the reaction chambers 2 and the supply chambers 4 in a controlled and independent manner, a thermal insulation wall 9 is preferably arranged in-between, through which the gas channels 3 pass. The growing single crystals 20 are depicted in different sizes. The intention here is to indicate that the growth rates in the individual systems can deviate from one another, particularly due to varying cross-sections of their gas channels 3.

Figure 5:
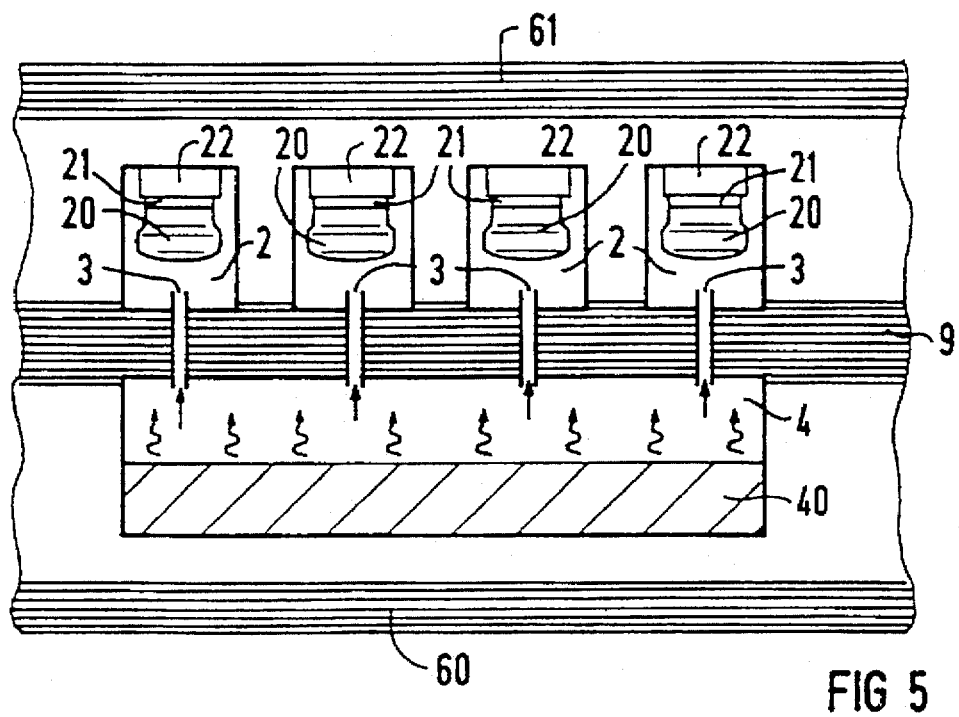
FIG. 5 is a cross sectional view of a fifth embodiment of the present invention including a plurality of reaction chambers, which are each connected via a gas channel to a common supply chamber, and comprising a common heating system.

In another specific embodiment in accordance with FIG. 5, a common supply chamber 4 with a supply 40, which is connected in each case by a gas channel 3 to the reaction chamber 2, is assigned to a plurality of reaction chambers 2. Preferably, an insulation wall 9 is again provided. A heating device 60 is assigned to the common supply chamber 4 and, again, a common heating device 61 is assigned to the reaction chambers 2. It is also possible to have a plurality of separate heating devices for the reaction chambers 2.

Also, in specific embodiments comprising several systems, it is possible to provide homogenization chambers, which are assigned to individual or to several reaction chambers 2 or supply chambers 4, and/or means for supplying a protective gas. It is also possible to have the seed crystals arranged in a common reaction chamber.

Preferred modifications of the grown SiC single crystal 20 are 4H, 6H and 15R. Preferably, the seed crystal 21 also consists of SiC of this modification.

All properly heat-resistant materials, in particular high-purity electrographite, are suitable as materials for the components of the device. Moreover, the walls can be provided with preferably pyrolytically produced, heat-resistant coatings.

What is claimed is:

1. A device for producing single crystals from a solid SiC supply, including a seed crystal having a crystallization surface, wherein the device comprises:
   a) a reaction chamber, wherein the seed crystal is arranged for growing the single SiC crystal out of a gas phase;
   b) a supply chamber, which is at least partially filled with the supply of solid SiC;
   c) a homogenization chamber;
   d) a first gas channel connecting the homogenization chamber to the supply chamber;
   e) a second gas channel connecting the homogenization chamber to the reaction chamber; and
   f) at least one heating device for producing SiC in the gas phase from the SiC supply in the supply chamber, for controlling the temperature in the homogenization chamber, and for adjusting a temperature distribution in the reaction chamber.

2. The device according to claim 1, wherein the second gas channel has an exhaust port disposed directly opposite the seed crystal, so that a center axis of the second gas channel is directed at least nearly perpendicularly to the crystallization surface of the seed crystal.

3. The device according to claim 2, wherein the supply chamber is arranged above the reaction chamber.

4. The device according to claim 2, wherein the supply chamber is arranged below the reaction chamber.

5. The device according to claim 1, wherein the supply chamber is arranged above the reaction chamber.

6. The device according to claim 1, wherein the supply chamber is arranged below the reaction chamber.

7. The device according to claim 1, wherein a separate heating device is assigned to the homogenization chamber.

8. The device according to claim 1, wherein the supply chamber, the homogenization chamber, the reaction chamber, and the first and second gas channels are disposed axially to one another.

9. The device according to claim 1, further comprising means for supplying a protective gas.

10. A device for producing single crystals from a solid SiC supply, including a plurality of seed crystals, each seed crystal having a crystallization surface, wherein the device comprises:
   a) at least one reaction chamber, wherein the seed crystals are arranged for growing single SiC crystals out of a gas phase;
   b) at least one supply chamber, wherein each of said at least one supply chamber is at least partially filled with the supply of solid SiC;
   c) at least one homogenization chamber;
   d) at least one first gas channel connecting the at least one homogenization chamber to the at least one supply chamber;
   e) a plurality of second gas channels connecting the homogenization chamber to the reaction chamber, wherein each second gas channel is directed to a corresponding seed crystal; and f) at least one heating device for producing SiC in the gas phase from the SiC supply in the at least one supply chamber, for controlling the temperature in the at least one homogenization chamber, and for adjusting a temperature distribution in the at least one reaction chamber.

11. The device according to claim 10, wherein the seed crystals are arranged in a common reaction chamber.

12. The device according to claim 11, wherein each of the at least one first gas channels are connected to a common supply chamber.

13. The device according to claim 10, wherein each of the at least one first gas channels are connected to a common supply chamber.

14. The device according to claim 10, wherein the at least one reaction chamber is separated from the at least one supply chamber by a thermal insulation wall, and a first heating device is assigned to the at least one reaction chamber, and a second heating device independent of the first heating device is assigned to the at least one supply chamber.

* * * * *